United States Patent [19]
Kablanian

[11] Patent Number: 6,104,663
[45] Date of Patent: Aug. 15, 2000

[54] MEMORY ARRAY WITH A SIMULTANEOUS READ OR SIMULTANEOUS WRITE PORTS

[75] Inventor: Adam Kablanian, San Jose, Calif.

[73] Assignee: Virage Logic Corp., Fremont, Calif.

[21] Appl. No.: 09/227,501

[22] Filed: Jan. 6, 1999

[51] Int. Cl.[7] .................................................. G11C 8/00
[52] U.S. Cl. .............................. 365/230.05; 365/230.06; 365/154
[58] Field of Search .................. 365/230.05, 230.06, 365/154

[56] References Cited

U.S. PATENT DOCUMENTS

| | | | |
|---|---|---|---|
| 4,287,575 | 9/1981 | Eardley et al. | 365/174 |
| 4,580,245 | 4/1986 | Ziegler et al. | 365/154 |
| 5,289,432 | 2/1994 | Dhong et al. | 365/230.05 |
| 5,953,281 | 9/1999 | Mataba | 365/230.05 |
| 5,959,931 | 9/1999 | Ueda | 365/230.05 |

*Primary Examiner*—David Nelms
*Assistant Examiner*—Connie C. Yoha
*Attorney, Agent, or Firm*—Fenwick & West LLP

[57] ABSTRACT

The simultaneous read or simultaneous write memory array of the present invention includes a core array of memory units, control logic, a first port I/O, a first port shift register, first port word line generation logic, a second port I/O, a second port shift register, and a second port word line generation logic. The memory unit includes a pair of cells formed from two inverters as well as read and write transistors. The pair of memory cells preferably use the same bit lines for being read or written. Still more particularly, the novel design of the memory units combines the read and write bit lines into a single bit line such that there is a first, single bit line for reading from a first cell in the memory unit and writing to a second cell in the memory unit; and there is a second, single bit line for reading from the second cell in the memory unit and writing to the first cell in the memory unit. This is advantageous because it reduces the number of bit lines needed for each cell and thereby reduces the overall area of the core array, reduces power dissipation, and reduces noise and cross talk.

18 Claims, 10 Drawing Sheets

MEMORY ARRAY WITH A SIMULTANEOUS READ OR SIMULTANEOUS WRITE PORTS

BACKGROUND OF THE INVENTION

1. Field of the Invention

This invention relates generally to the field of memory logic devices and more specifically to a simultaneous read or simultaneous write (SRSW) array. More particularly, the present invention relates to memory array having a first and second port for reading and writing to the array. Still more particularly, the present invention relates to memory array that may have a plurality of read ports and a plurality of write ports.

2. Description of the Background Art

Memory devices are well known in the semiconductor industry. In particular, memory cores for integrated circuits continue to be improved. Because of the proliferation and popularity of application specific integrated circuits (ASIC), there is a need for improved designs for memory cores or arrays. New memory cores are needed because of the every decreasing size requirements for ASICs. For example, new uses for ASICs such as cellular telephones, portable computers, and hand held devices require new memory cores that require less circuit area to implement. Even despite the increases in transistor density provided by new semiconductor process technologies, there continues to be a need for memory cores or array designs that require less area.

Yet another reason for requiring smaller memory cores or arrays is that they consume less power. Especially, in the applications noted above such as cellular telephones, portable computers, and hand held devices, the power available is severely limited. Since smaller memory cores consume less power, the reduced power requirements also drive the need for smaller and more energy efficient memory cores. Thus, there is a need for memory cores that consume less power.

Still another reason for memory cell arrays of smaller size is to increase the memory capacity in the same area. Since ASICs are more complicated and perform many more functions than in the past, the memory cell arrays must be larger in size, yet fit in the same area or less. Furthermore, the area of the ASIC dedicated to other components using or accessing the memory cell arrays has increased because of their increased complexity and computing abilities. Therefore, more of the area is dedicated to the portion of the ASIC other than memory. Thus, there is a need for a memory cell that is smaller in size.

Finally, another shortcoming of the prior art memory cells is there ability to be reduced in size as the semiconductor process technologies are reduced in size. More particularly, one problem encountered as the process technologies are reduced to smaller and smaller dimension is that the increased noise and cross talk between the signal lines used to read the memory cells. Thus, there is also a need for a memory cell design that reduces the amount of noise that is transmitted between signal lines used for the memory cell.

Therefore, there is a need for memory cell arrays that are smaller in size, consume less power, and reduce electrical interference.

SUMMARY OF THE INVENTION

The present invention overcomes the deficiencies and limitations of the prior art with a unique memory cell array having simultaneous read or simultaneous write (SRSW) ports. The SRSW memory array of the present invention includes a core array of memory units, control logic, a first port I/O, a first port shift register, first port word line generation logic, a second port I/O, a second port shift register, and a second port word line generation logic. The present invention is particularly advantageous because it employs a plurality of novel memory units. The memory unit according to the present invention includes a pair of cells formed from inverters as well as read and write transistors. One cell of the pair is a first port (port A) cell and the other cell is a second port (port B) cell. The pair of memory cells preferably use the same bit lines for being read or written. Still more particularly, the novel design of the present invention combines the read from port A bit line and write to port B bit line into a first, single bit line for reading from port A and writing to port B for the pair of cells that form a memory unit. Similarly, the present invention provides a second, single bit line for reading from port B and writing to port A for the pair of cells that are the same memory unit. This is particularly advantageous because this design reduces the number of bit lines need for each cell and thereby reduces the overall area of the core array and reduces noise and cross talk.

These and other features and advantages of the present invention may be better understood by considering the following detailed description of a preferred embodiment of the invention. In the course of this description, reference will frequently be made to the attached drawings.

DETAILED DESCRIPTION OF THE PREFERRED EMBODIMENTS

Figure 1:
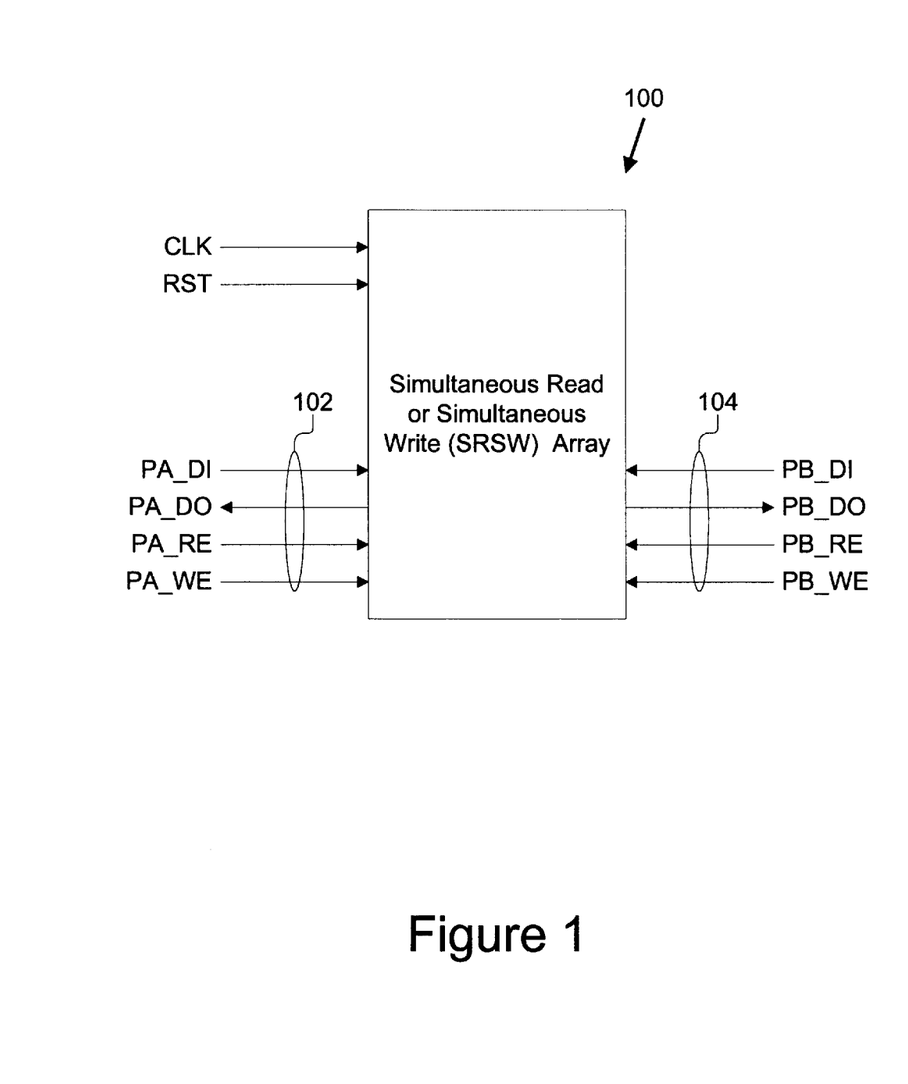
FIG. 1 is a high-level block diagram of a first embodiment of a simultaneous read or simultaneous write (SRSW) array employing the principles of the present invention.

Referring now to FIG. 1, a high-level block diagram of a first embodiment of a simultaneous read or simultaneous write (SRSW) array 100 according to the present invention is shown. FIG. 1 is provided to describe the signals received from and sent to the SRSW array 100. The SRSW array 100 is a memory device capable of being written simultaneously to a plurality of arrays or read simultaneously from a plurality of arrays. The SRSW array 100 is simultaneously written or simultaneously read utilizing a first port (port A) and a second port (port B). Exemplary operations on such a two port array SRSW array 100 include: 1) writing to both port A and port B; 2) writing to port A with port B idle; 3) writing to port B with port A idle; 4) reading from both port A and port B; 5) reading from port A with port B idle; and 6) reading from port B with port A idle. The SRSW array 100 is a logical connection of dual direction shift registers as will be described in more detail below with reference to FIGS. 2A & 2B. In one embodiment of the present invention, the inputs to the SRSW array 100 include a clock input (CLK), a reset input (RST), a port A data input (PA_DI), a port A read enable (PA_RE), a port A write enable (PA_WE), a port B data input (PB_DI), a port B read enable (PB_RE), and a port B write enable (PB_WE). The outputs from the SRSW array 100 include a port A data output (PA_DO) and a port B data output (PB_DO). The port A data outputs and the port A data inputs form a first 102, and the port B data outputs and the port B data inputs for a second port 104.

Those skilled in the art will recognize that the size or bit width of the port A data inputs and outputs, and port B data inputs and outputs could be any variety of sizes. For example, the port B data path width can be double that of the port A path. For the purposes of describing the present invention, the SRSW array 100 will be described below with reference to a specific context where the port B 104 has 66 bits and the port A 102 has 33 bits. However, those skilled in the art will realize the invention is applicable to a variety of SRSW arrays regardless of their bit width. Only by way of example, the pin definitions and a timing diagram for such a 66 by 33 bit SRSW array 100 are provided in Appendix A and FIG. 8, respectively. Furthermore, those skilled in the art will recognize that the present invention can provide more ports that two. Once such example is described below with reference to FIG. 7.

Figure 2A:
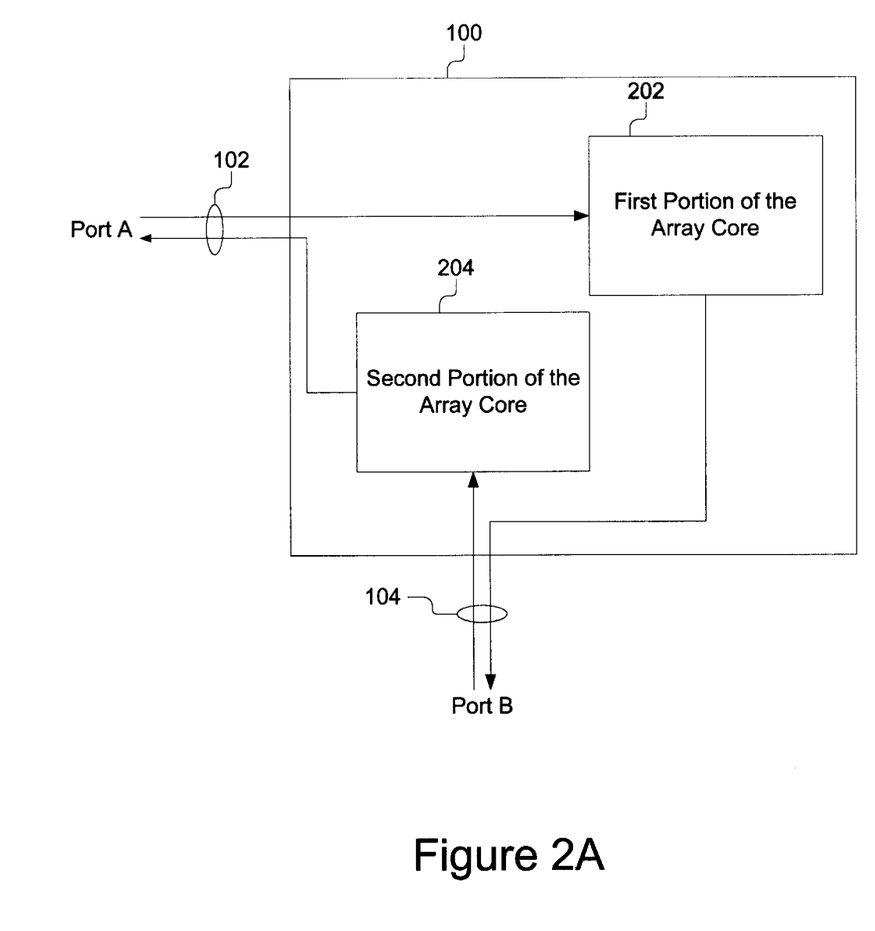
FIG. 2A is a high-level block diagram of the first embodiment of a SRSW array functionally showing first and second portions of the array core.

As shown in FIG. 2A, the SRSW array 100 is preferably implemented in what functionally can be considered to be two portions 202, 204 of the array 100. In other words, each portion 202, 204 of the array 100 provides a cell that can be used depending on the data path used to store and retrieve data. Each memory unit can be considered to be a respective cell from each portion 202, 204 of the array 100. The first portion 202 of the array 100 is coupled to the port A 102 to receive data input and output data via the port B 104. The first portion of the 202 of the array is also referred to as an A-to-B portion 202 and provides for loading of the array 100, for example, in 33-bit words and output in 66-bit words. The second portion 204 of the array 100 is coupled to the port B 104 to receive data input and outputs data to the port A 102. The second portion 204 of the array 100 is also referred to as a B-to-A portion 204, and provides for loading of the array 100, for example, in 66-bit words and output in 33-bit words.

Figure 2B:
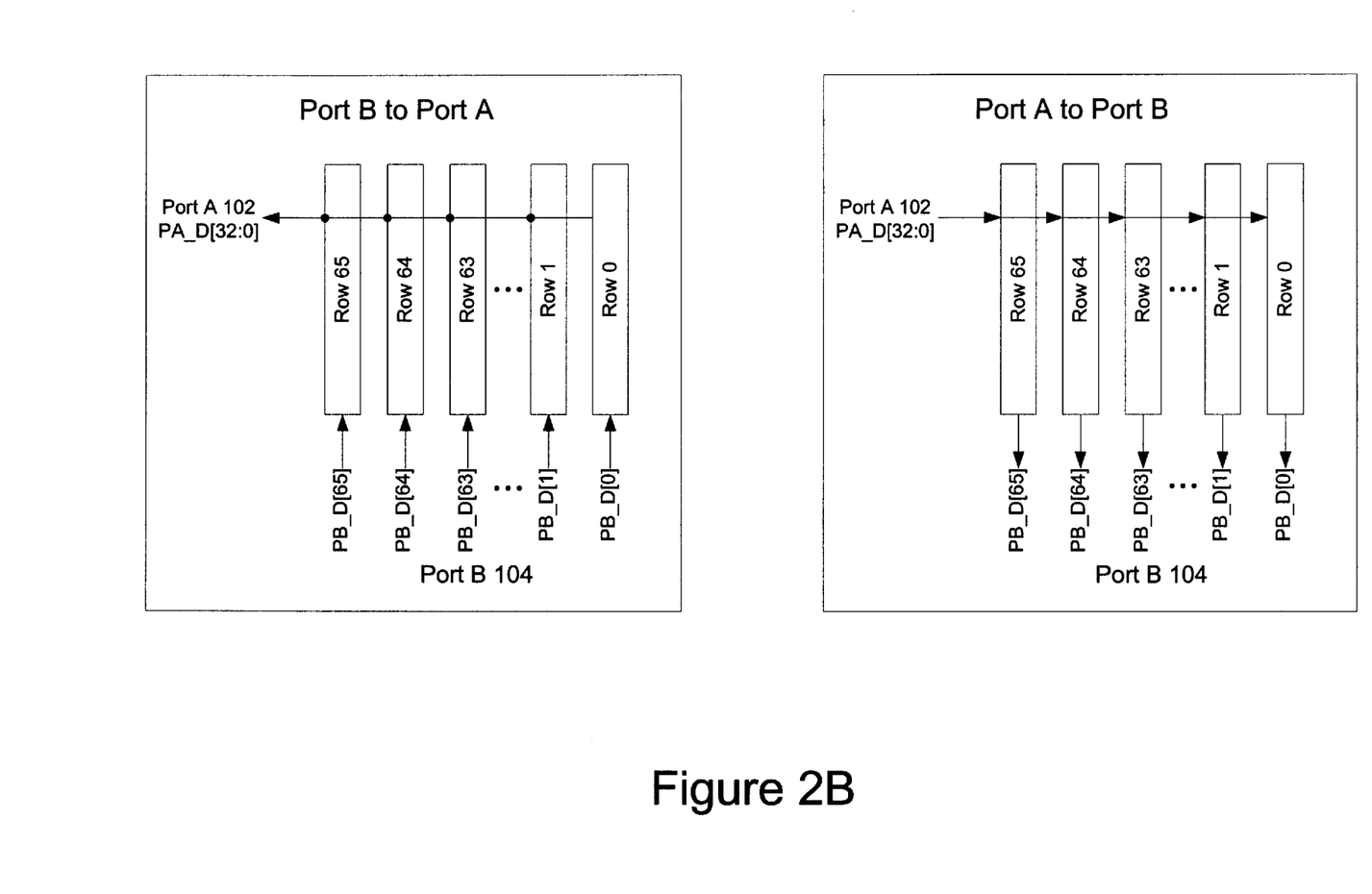
FIG. 2B is a high-level block diagram of the first embodiment of the SRSW array showing how the array is read and written in simultaneous reads and simultaneous writes.

Referring now also to FIG. 2B, the logical data paths provided by the array 100 of the present invention will be described. In the example used to describe the present invention, the port B is 66 bits and the port A is 33 bits. As noted above, the array 100 is essentially a collection of two sets of sixty-six by thirty-three (66×33) shift registers in which the data flows in either one of two directions: A-to-B or B-to-A. The left side of the diagram illustrates the port B-to-A path. On the port B-to-A path, the rows are first shifted or loaded with data from the port B 104. Once the array 100 is loaded, it can be read one word or row at a time through the port A 102. In the exemplary case, bits are shifted in 66-bit words and later output in 33-bit words via the port A 102. The array 100 can also be written at port B at the same time data is being written to port A (simultaneous write to both port A and B).

The right side of the diagram illustrates the port A-to-B path. On the port A-to-B path, the rows are first loaded sequentially, utilizing a shift register as a word line decoder 408 (See FIG. 4), one 33-bit word at a time using port A 102. Once the array 100 is loaded, the data can be shifted out to the port B 104 in 66-bit words. While not shown in FIG. 2B, there is another shift register 414 provided, that is used again with word line generator 412 as a word line decoder (See FIG. 4), and selects the array 100 to be read via the port B 104. When writing to port A 102, port B 104 can either be idle or write data to the array 100. In other words, the array 100 allows (1) simultaneous writes to both port A 102 and port B 104, (2) while writing to port A, port B is idle, or (3) while writing to port B, port A is idle. Similarly, when the shift register 414 of the port B 104 reads data out, the port A 102 can either be idle or read data from the array 100. The array 100 alternatively allows (1) simultaneous reads of both port A 102 and port B 104, (2) while reading port A 102, port B 104 is idle, or (3) while reading to port B 104, port A 102 is idle.

Figure 3A:
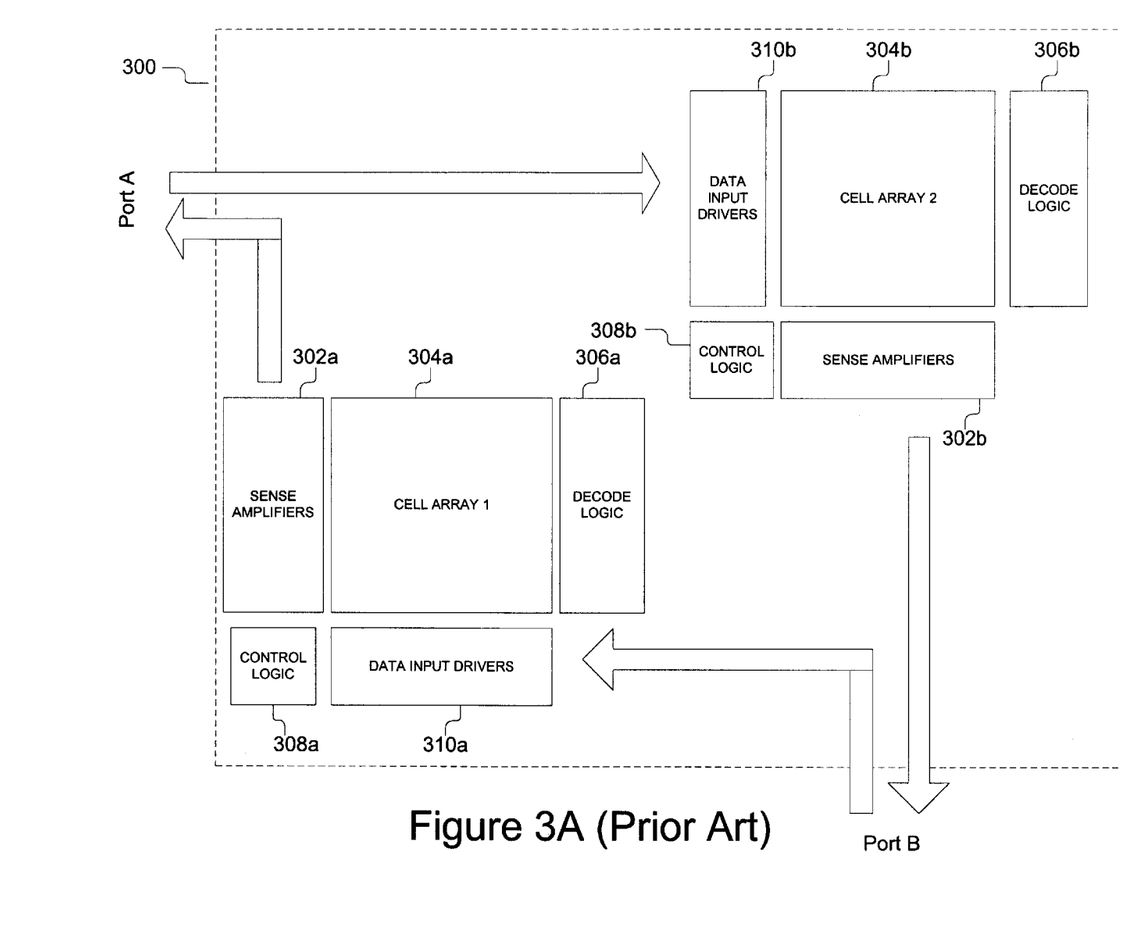
FIG. 3A is a block diagram showing an example layout for a prior art SRSW array.
Figure 3B:
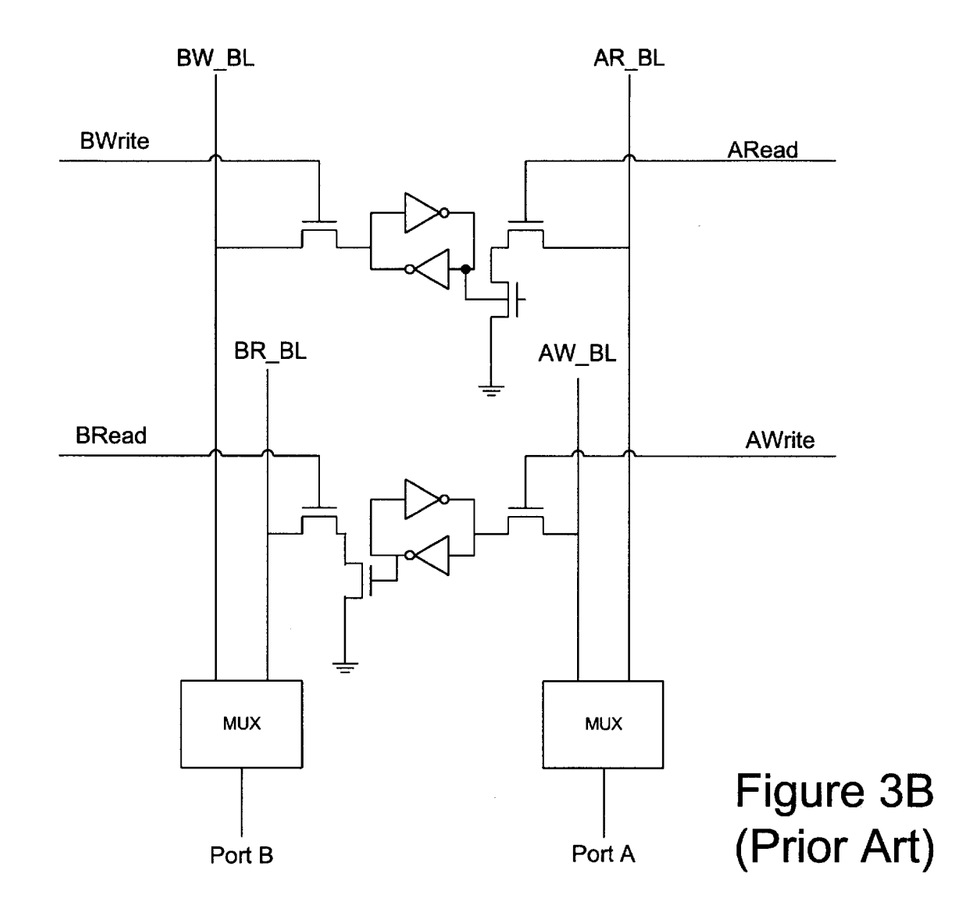
FIG. 3B is a circuit diagram showing a cell of a prior art SRSW array.

Referring now to FIGS. 3A and 3B, the layout and cell used in the prior art for such an array 300 are shown. The layout and cell are described to contrast them with the present invention and highlight the novel features of the present invention. FIG. 3A illustrates a layout for prior art array 300. The prior art array 300 has a first cell array 304a and a second cell array 304b to provide the dual direction functionality described above with reference to FIG. 2. Each cell array 340a, 304b has a respective set of sense amplifiers 302a, 302b and input drivers 310a, 310b to provide the data input and output capabilities. Each cell array 340a, 304b also has respective control logic 308a, 308b and decoding logic 306a, 306b. Each cell array 340a, 304b requires this logic in order to provide the functionality required and perform properly. One of the major shortcomings of the prior art is the duplication of port A bit lines, port B bit lines and decode logic. This increases the size of the array, and its power consumption.

As shown in FIG. 3B, each prior art cell used for the cell arrays 340a, 304b are formed from a pair of inverters and associated transistors. The first cell (upper cell) is provided for the B-to-A path where data is loaded from the port B and read from the port A. The multiplexer couples the port B to the port B write bit line (BW_BL), and access to the upper cell is provided by a first transistor controlled by the port B write (BWrite) signal. On the read path, the port A read bit line (AR_BL) couples the upper cell to the port A via a second multiplexer and is provided by a second transistor controlled by the port A read (ARead) signal. Likewise, a second cell (lower cell) is provided for the A-to-B path where data is loaded from the port A and read from the port B. The multiplexer couples port A to the port A write bit line (AW_BL), and access to the lower cell is provided by a third transistor controlled by the port A write (AWrite) signal. On the read path, a fourth transistor controlled by the port B read (BRead) signal to access the lower cell and the signal is output via the port B read bit line (BR_BL) that couples the lower cell to the port B via the second multiplexer. While the multiplexers are shown as being close to the cells of the array 300, those skilled in the art will recognize that the multiplexers are typically located on the periphery of the array core, thus the bit lines are forced to extend across the entire array core. Moreover, a pair of multiplexers is required for the port A and port B in the array, and therefore, their numbers can be numerous. In the exemplary case of an array that is 66 by 33, the prior art design would require about a hundred such multiplexers.

Figure 4:
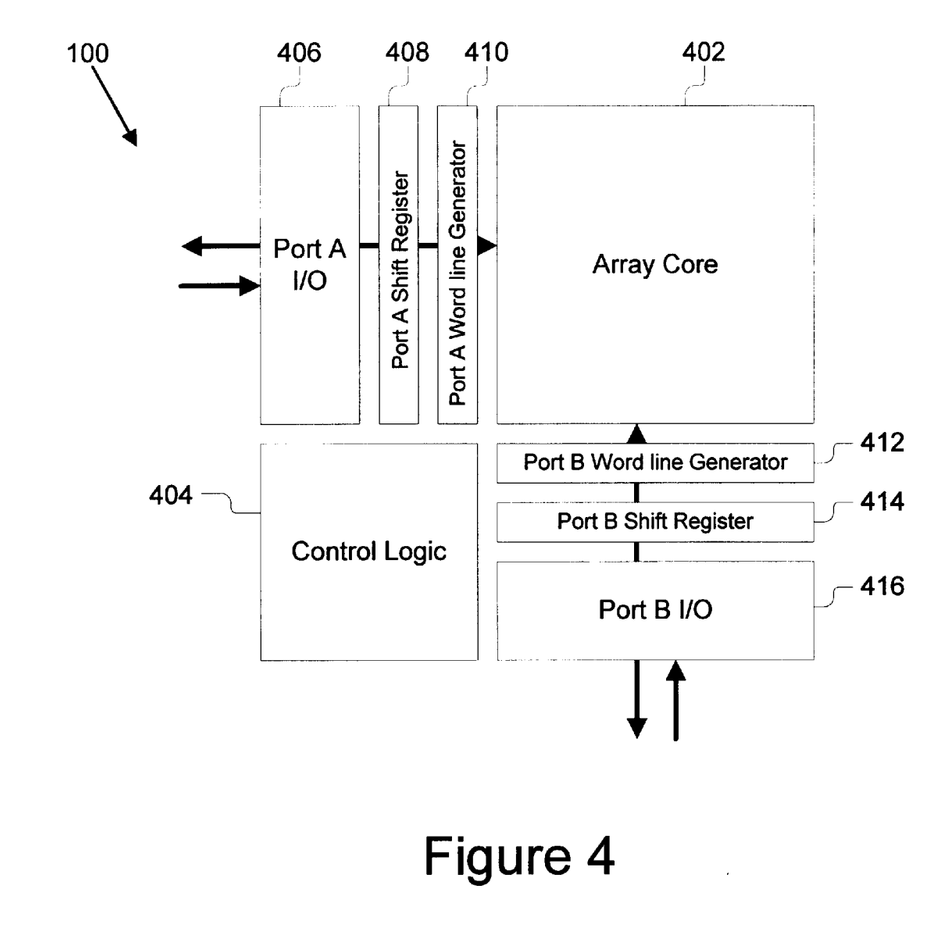
FIG. 4 is a block diagram showing a preferred layout for the SRSW array of the present invention.

Referring now to FIG. 4, a preferred layout for the array 100 of the present invention is shown. The SRSW memory array 100 of the present invention includes a core array of memory units 402, control logic 404, port A I/O 406, a port A shift register 408, port A word line generation logic 416, a port B I/O 416, a port B shift register 414, and a port B word line generation logic 412. FIG. 4 generally illustrates the paths through the respective components to store and retrieve information from the core array 402. The core array 402, port A I/O 406, port A shift register 408, port A word line generation logic 416, port B I/O 416, port B shift register 414, and port B word line generation logic 412 are controlled by signals generated and provided from the control logic 404. The port A I/O 406, port A shift register 408, and port A word line generation logic 416 provide port A 102 with access to and from the core array 402. Similarly, the port B I/O 416, port B shift register 414, and port B word line generation logic 412 provide port B 104 with access to and from the core array 402.

The core array 402 of memory units 500 is used to store the data as has been described above generally with reference to FIGS. 1 and 2. Each of the memory units 500 preferably includes a pair of cells formed from a pair of inverters as well as read and write control transistors. One cell of the pair is a port A-to-B cell and the other cell is a port B-to-A cell. The pair of memory cells preferably use the same bit lines for being read or written. A preferred embodiment of the memory unit 500 is described below with reference to FIG. 5. The core array 402 is particularly advantageous because the core array 402 effectively merges the port B-to-A and the port B-to-A portions into a single array. This is advantageous because in conjunction with the novel memory unit 500 design described below, this results in a significant decrease in the area required for array 100 when compared with the prior art array 300. For example, an SRSW array 100 constructed according to the present invention will be three to five times smaller in die area than the prior art array 300.

The control logic 404 receives and outputs the clock signal, the reset signal, the write enable signal, and the read enable signal, as well as other control signals. The control logic 404 manages movement of data from ports A and B 102, 104, through the respective port A I/O 406, port A shift register 408, port A word line generation logic 416 port B I/O 416, port B shift register 414, and port B word line generation logic 412 to the array core 402. The control logic 404 handles timing, addressing and assertion of read and write control signals. Much of the control logic 404 is combinational logic designed to achieve the timing shown in FIG. 8. Those skilled in the art will understand how such control logic can be implemented. It should be noted that the control logic 404 is smaller than that of the prior art. In the case where port B has bits equal to n times the bits of port A (such as our exemplary case where b has n times 33 bits where n=2), then the same shift register can be used to select and decode the word line, thus, reducing the shift register 414, 408 area by a factor of two.

The port A I/O 406 couples the port A 102 to the bit lines (530, 532) of the array core 402. The port A I/O 406 is a plurality of I/O circuits that each couple an input line and an output line of the port A 102 to a single bit line of the array core 402. Data from this line must be stored for assertion on the bit line (input) and stored for assertion on the output lines (output), and the port A I/O 406 performs this function. The port A I/O 406 includes a sense amplifier combination of inverters and transistors, and first and second flip-flop for storage of data to and from the bit line. An exemplary embodiment of such an I/O circuit 600 will be described below with reference to FIG. 6.

The port B I/O 416 couples port B 104 to the bit lines 530, 532 of the array core 402. The port B I/O 416 is similarly a plurality of I/O circuits that each couple an input line and an output line of port B 104 to a single bit line of the core array 402. Data from this line must be stored for assertion on the bit line (input) and stored for assertion on the output lines (output), and the port B I/O 416 performs this function. An exemplary embodiment of such an I/O circuit for a single pair of input and output bits will be described below with reference to FIG. 6. For the example, 33 such I/O circuits are needed for the port A I/O 406 while 66 such circuits are need for the port B I/O 416.

The port A shift register 408 and port B shift register 414 are preferably identical in functionality and differ only in their couplings and size. For example, the port A shift register 408 is 33 bits in size and is coupled to drive the port A word line generator 410 while the B shift register 414 is 66 bits in size and coupled for use with the port B word line generator 412. Thus, the functionality described below for the port A shift register 408 applies equally for the port B shift register 414 to that extent. The port A shift register 408 is a plurality of buffer registers for storing data that asserts a single word line, with the remaining word lines being unasserted. The port A shift register 408 provides a buffer register for each bit in port A 102. Thus, for the example having 33 parallel bits, the port A shift register 408 would have 33 buffer registers. Each buffer register of the port A shift register 408 has a single output line used for both reading and writing a particular word at different times. Each buffer register is identical in implementation, and receives control signals from the control logic 404. The line of each buffer register is also selectively coupled in response to signals from the control logic 404 by the port A word line generation logic 410 to various memory units 500 in the array core 402 to select which word will be read/written.

The port A word line generation logic 410 includes a plurality of line drivers or inverters. The port A word line generation logic 410 drives signals from the buffer registers of the port A shift register 408 on respective word lines of the core array 402. The port B word line generation logic 412 is identical in functionality to port A word line generation logic 416, but it is coupled to the output of the port B shift register 414 and drives the word lines corresponding to port B 104 in the array core 402.

Figure 5:
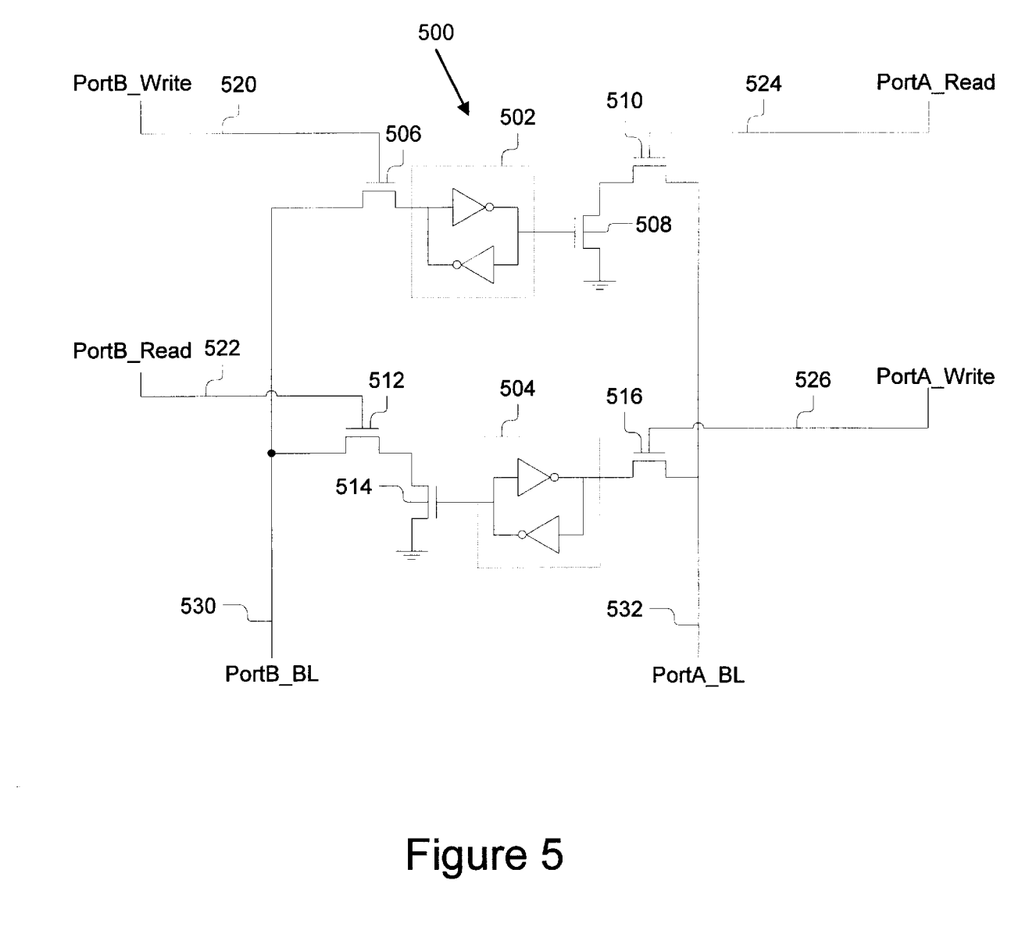
FIG. 5 is a circuit diagram showing a first and preferred embodiment for a memory unit of the SRSW array of the present invention having two ports.

Referring now to FIG. 5, a preferred embodiment for the memory unit 500 of the core array 402 is shown in detail. The memory unit 500 preferably comprises a port B-to-port A (B2A) cell 502, a port A-to-port B (A2B) cell 504, and a plurality of transistors 506, 508, 510, 512, 514 and 516. The memory unit 500 advantageously provides a single port B bit line (PortB_BL) 530 and a single port A bit line (PortA_BL) 532 for providing data to and receiving data from the memory unit 500. This is particularly advantageous because it reduces the number of bit lines in the core array 402 by half compared to the prior art, and therefore provides reduced area requirements, power consumption and noise between the signal lines. The noise factor can be a particular problem because of the sensing mechanism used to read the bit lines.

As shown in FIG. 5, the B2A cell 502 has an input coupled by a first transistor 506 to the port B bit line 530. The first transistor 506 is controlled by signal line 520 that is coupled to the gate of the first transistor 506 by line 520 to receive the port B write signal. The output of the B2A cell 502 is coupled to the gate of a second transistor 508. The second transistor 508 is coupled between ground and a third transistor 510. When the output of the cell is high, the second transistor 508 effectively closes to couple the drain of the third transistor 510 to ground. The third transistor 510 is coupled between the second transistor 508 and port A bit line 532. The gate of the third transistor 510 is controlled by line 524 that is coupled to receive the port A read signal. The third transistor 510 couples the inverted output of the B2A cell 502 when the port A read signal is asserted. Thus, for the B2A cell 502, the port B bit line 530 is used for writing, and the port A bit line 532 is used for reading.

The A2B cell 504 is coupled in a similar fashion using again the port B bit line 530 and the port A bit line 532. However, for the A2B cell 504, the port B bit line 530 is used for reading, and the port A bit line 532 is used for writing. More specifically, the input of the A2B cell 504 is coupled by the fourth transistor 516 to the port A bit line 532. The gate of the fourth transistor 516 is controlled by the signal on line 526 that is coupled to receive the port A write signal. When this signal is asserted, the fourth transistor 516 closes to apply the signal on the port A bit line 532 to store it in the A2B cell 504. The output of the A2B cell 504 is coupled to the gate of a fifth transistor 514. The fifth transistor 514 is coupled between the sixth transistor 512 and ground. The sixth transistor 512 controls the access of the A2B cell 504 output to the port B bit line 530. The sixth transistor 512 is coupled between the port B bit line 530 and the fifth transistor 514. The gate of the sixth transistor 512 is coupled to line 522 to receive the port B read signal. When the port B read signal is asserted, the output of the A2B cell 504 is effectively coupled to the port B bit line 530. Thus, it is apparent that the port A bit line 532 is used for writing the A2B cell 504 and the port B bit line 530 is used for reading the A2B cell 504. This is particularly advantageous since each of the bit lines 530, 532 is used for two functions that are assured to not be overlapping in time.

Figure 6:
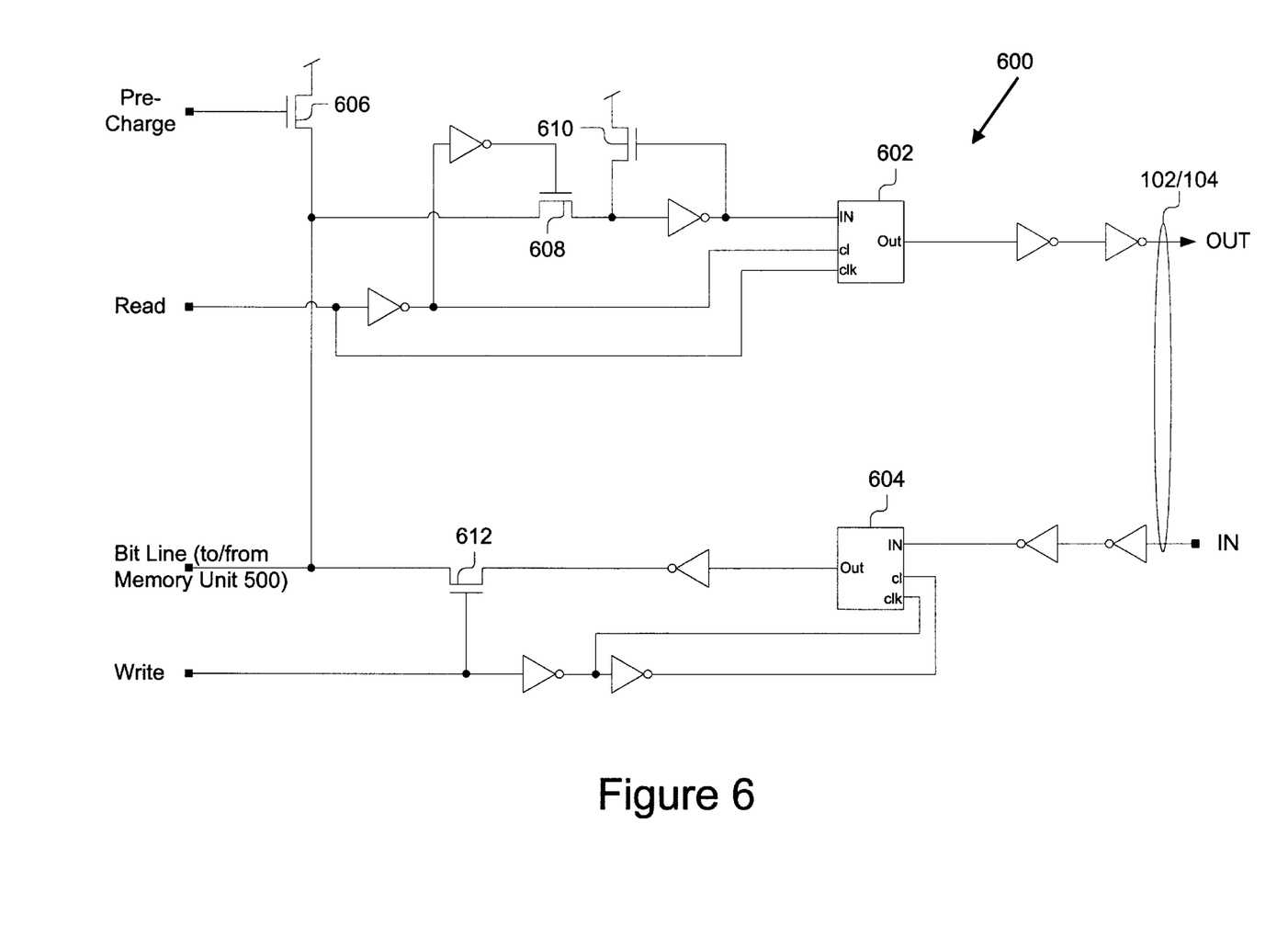
FIG. 6 is a circuit diagram showing a preferred embodiment for input and output logic of the SRSW array of the present invention.

Referring now to FIG. 6, a preferred embodiment for an I/O circuit 600 that is one of a plurality of I/O circuits forming portions of both the port A I/O 406 and the port B I/O 416 will be described in more detail. The I/O circuit 600 preferably comprises a first flip-flop 602, a second flip-flop 604, a plurality of transistors 606, 608, 610 and 612, and a plurality of inverters.

The first flip-flop 602 is used to store data being output by the array 100. The output of the first flip-flop 602 is coupled by a pair of inverters to provide an output such as forming the port A data outputs or the port B data outputs. The input of the first flip-flop 602 is coupled by an inverter and a transistor 608 to a bit line in FIG. 6. The bit line is coupled by transistor 606 before being read and written to a high state. Transistor 606 is coupled to receive a pre-charge signal from the control logic 404 before being written and read. The first flip-flop 602 and the transistor 608 are controlled by the read enable signal (READ) that is applied to the gate of the transistor 608 after passing through a pair of inverters, that is applied to clock input of the first flip-flop 602, and that is inverted and applied to reset input of the first flip-flop 602.

The second flip-flop 604 is used to store data being input to the array 100. The input of the second flip-flop 604 is coupled by inverters to provide an input such as forming PA_DI or PB_DI. An inverter and a transistor 612 couple the output of the second flip-flop 604 to the bit line (e.g., 530, 532). The second flip-flop 604 and the transistor 608 are controlled by the write enable signal (WRITE) that is applied to the gate of the transistor 608 and to reset input of the second flip-flop 604, and that is inverted and applied to clock input of the second flip-flop 604.

Figure 7:
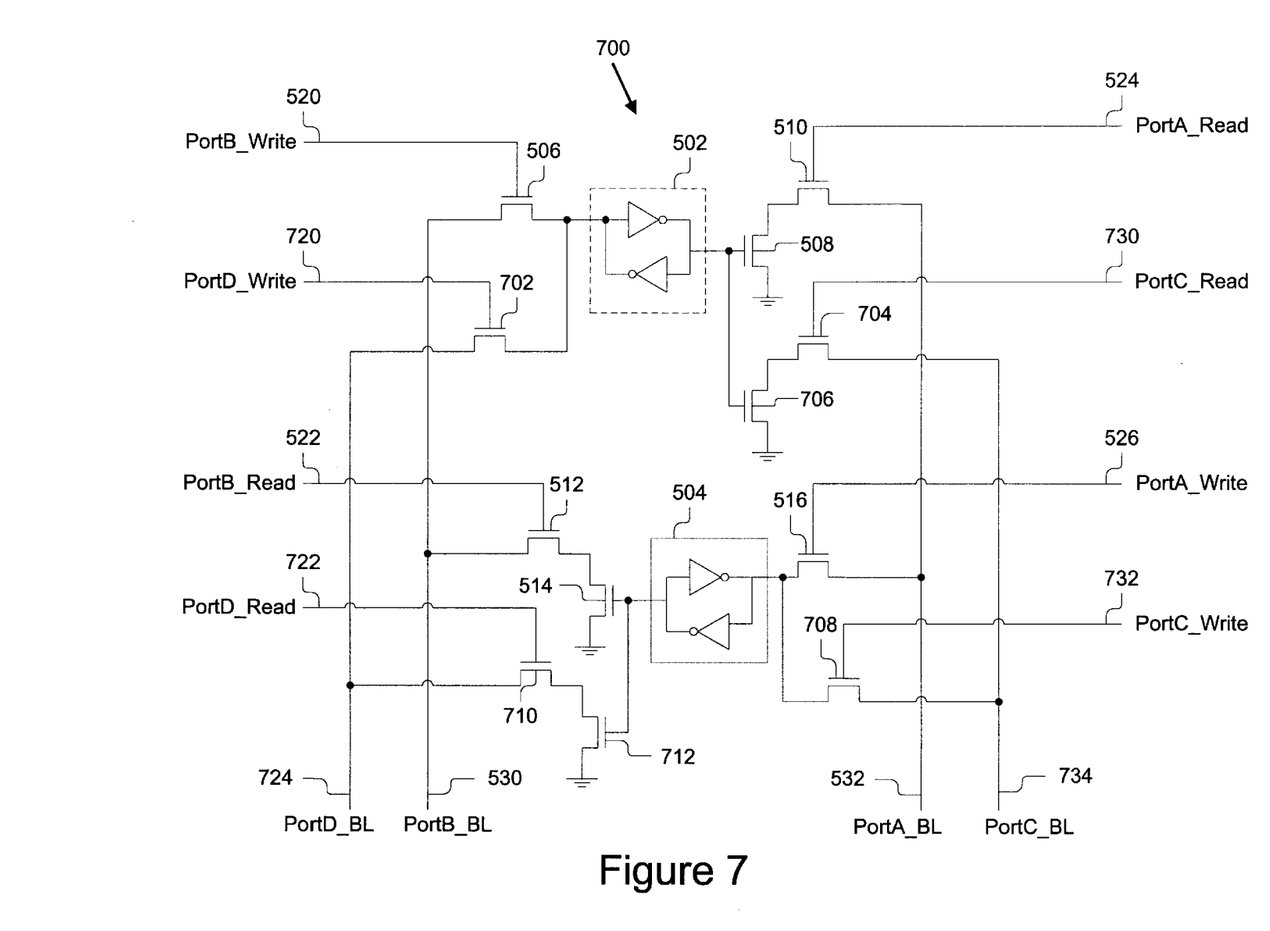
FIG. 7 is a circuit diagram showing a second and alternate embodiment for the memory unit of the SRSW array of the present invention having four ports.
Figure 8:
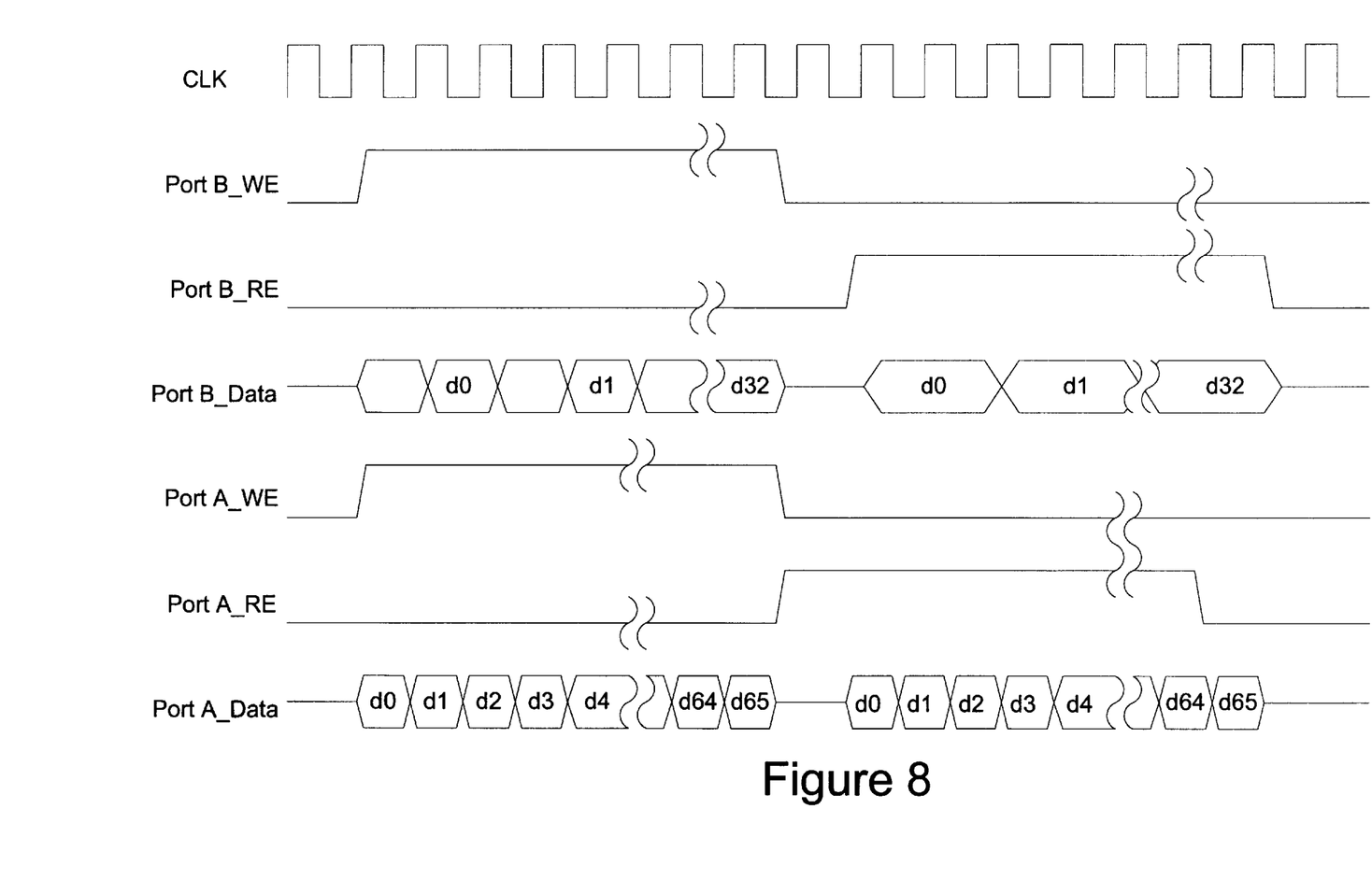
FIG. 8 is timing diagram for reading and writing an exemplary SRSW array according to the present invention having two ports.

Referring now to FIG. 7, a circuit diagram showing a second and alternate embodiment for the memory unit 700 of the SRSW array 100 of the present invention is shown. This second embodiment uses the principles of the present invention to provide the memory unit 700 having four ports: port A, port B, port C and port D. Those skilled in the art will understand how a variety of other embodiments of the memory unit having any number of n ports, where n is even, could be implement consistent with the principles of the present invention. The second embodiment of the memory unit 700 is similar to the first embodiment of the memory unit 500 of FIG. 5, and therefore, like reference numerals are used to reference like parts for ease of understanding and convenience. In addition to the functionality described above with reference to FIG. 5, the second embodiment of the memory unit 700 includes additional transistors 702, 704, 706, 708, 710 and 712 and two additional bit lines 724, 734. This advantageously allows the memory unit 700 to perform many additional simultaneous operations including: 1) reading ports A and C simultaneously, 2) reading ports B and D simultaneously, 3) reading ports A, B, C, and D simultaneously, 4) writing ports A and (B or D) simultaneously, and 5) writing ports C and (B or D) simultaneously.

Adding transistors 704, 706 and 708 provides the third port, port C. The B2A cell 502 can be read using port C, and transistors 704 and 706 are provided for this purpose. The output of the B2A cell 502 is coupled to the gate of transistor 706. Transistor 706 is coupled between ground and transistor 704. When the output of the cell 502 is high, transistor 706 effectively closes to couple the drain of the transistor 704 to ground. Transistor 704 is coupled between the transistor 706 and port C bit line 734. The gate of transistor 704 is controlled by line 730 that is coupled to receive the port C read signal. The transistor 704 couples the inverted output of the B2A cell 502 when the port C read signal is asserted. Thus, for the B2A cell 502, the port C bit line 734 is used for reading. The last transistor 708 forming port C is coupled to the other cell 504. The input of the A2B cell 504 is coupled by the transistor 708 to the port C bit line 734. The gate of the transistor 708 is controlled by the signal on line 732 that is coupled to receive the port C write signal. When this signal is asserted, the transistor 708 closes to apply the signal on the port C bit line 734 to store it in the A2B cell 504. Thus, transistor 708 and port C bit line 734 are used to write to A2B cell 504.

Port D is provided for writing to the B2A cell 502 and reading from the A2B cell 504. The functionality for port D is also provided by three transistors 702, 710, 712 and an additional bit line 724. Transistor 702 is provided for writing to the B2A cell 502. The B2A cell 502 has an input coupled by transistor 702 to the port D bit line 724. Transistor 702 is controlled by signal line 720 that is coupled to the gate of the transistor 702 by line 520 to receive the port B write signal. Transistors 710 and 712 are provided for reading from the A2B cell 504. The output of the A2B cell 504 is coupled to the gate of transistor 712. Transistor 712 is coupled between the transistor 710 and ground. Transistor 710 controls access to the A2B cell 504 output to the port D bit line 724. Transistor 710 is coupled between the port D bit line 724 and the transistor 710. The gate of transistor 710 is coupled to line 722 to receive the port D read signal. When the port D read signal is asserted, the output of the A2B cell 504 is effectively coupled to the port D bit line 724. Thus, it is apparent that the port D bit line 724 is used for reading from the A2B cell 504 and writing to the B2A cell 502.

It is to be understood that the specific mechanisms and techniques that have been described are merely illustrative of one application of the principles of the invention. Numerous additional modifications may be made to the apparatus described above without departing from the true spirit of the invention.

APPENDIX A

| Signal Name | Width | Direction | Function |
|---|---|---|---|
| Clk | 1 | Input | Clock |
| RESET_ | 1 | Input | Reset |
| Port A (33) | | | |
| PA_DI | 33 | Input | Port A Data In |
| PA_DO | 33 | Output | Port A Data Output |
| PA_WE | 1 | Input | Port A Write Enable |
| PA_RE | 1 | Input | Port A Read Enable |
| Port B (66) | | | |
| PB_DI | 66 | Input | Port B Data In |
| PB_DO | 66 | Output | Port B Data Output |
| PB_WE | 1 | Input | Port B Write Enable |
| PB_RE | 1 | Input | Port B Read Enable |

What is claimed is:

1. A memory array capable of being simultaneously read or simultaneously written, the memory array having a plurality of ports, the memory array comprising:
   a core array of memory units, each of the memory units for storing and providing data, the core array having a plurality of control inputs;
   a first port using a first, single bit line to send and receive data from a selected memory unit of the core array;
   a second port using a second, single bit line to send and receive data from the selected memory unit of the core array;
   control logic for receiving control signals, the control logic having inputs and outputs, the inputs of the control logic coupled to receive read and write control signals, and the outputs of the control logic coupled to the plurality of control inputs of the core array, the control logic capable of simultaneously writing the first port and the second port of the selected memory unit using the first bit line and the second bit line.

2. The memory array of claim 1 wherein the selected memory unit comprises:
   a first cell for storing and providing a bit of data, the first cell having an input and an output, the input of the first cell coupled to the first port by the first bit line, and the output of the first cell coupled to the second port by the second bit line; and
   a second cell for storing and providing a bit of data, the second cell having an input and an output, the input of the second cell coupled to the second port by the second bit line, and the output of the second cell coupled to the first port by the first bit line.

3. The memory array of claim 2, wherein the input of the first cell is coupled to the first bit line by a first transistor, the first transistor having a gate coupled to receive a first port write signal for selectively coupling the input of the first cell to the first bit line.

4. The memory array of claim 3, wherein the output of the first cell is coupled to the second bit line by a second transistor, the second transistor having a gate coupled to receive a second port read signal for selectively coupling the output of the first cell to the second bit line.

5. The memory array of claim 4, wherein the input of the second cell is coupled to the second bit line by a third transistor, the third transistor having a gate coupled to receive a second port write signal for selectively coupling the input of the second cell to the second bit line.

6. The memory array of claim 5, wherein the output of the second cell is coupled to the first bit line by a fourth transistor, the fourth transistor having a gate coupled to receive a first port read signal for selectively coupling the output of the second cell to the first bit line.

7. The memory array of claim 1, wherein the first port and the second port each further comprise:
   data I/O logic having a plurality of first data input lines forming inputs of the port, a plurality of data output lines forming outputs of the port, and a plurality of bi-directional lines for receiving and sending signals from and to the core array; and
   a word line decoder coupled to the control logic and to the core array for selecting groups of memory units for reading or writing on the bi-directional lines.

8. The memory array of claim 7, wherein the data I/O logic comprises
   a sense amplifier coupled to a corresponding bi-directional line for receiving and amplifying signals applied on the corresponding bidirectional line;
   a first buffer register for storing data input to the core array, an input of the first buffer forming an input line, an output of the first buffer register coupled to the bi-directional line; and
   a second buffer register for storing data output from the core array, an input of the second buffer register coupled to the output of the sense amplifier, and the output of the forming an output line.

9. The memory array of claim 7, wherein the first buffer register and second buffer register are D-flip-flops.

10. The memory array of claim 7, wherein word line decoder comprises: a shift register having data outputs, and control inputs, the control inputs coupled to the control logic, the outputs of the shift register coupled to word line generation logic, and the data outputs of the word generation logic coupled to respective word lines of the core array.

11. The memory array of claim 1, further comprising:
   a third port using a third , single bit line to send and receive data from at least one memory unit of the core array; and
   a fourth port a fourth, single bit line to send and receive data from at least one memory unit of the core array.

12. The memory array of claim 1 further comprising n additional ports, wherein n is an even number and each of the n additional ports includes at least one respective single bit line to send and receive data from at least one memory unit of the core array.

13. A memory unit for an array, the memory unit comprising:
   a first cell for storing and providing a bit of data, the first cell having an input and an output, the input of the first cell coupled to the first bit line, and the output of the first cell coupled to the second bit line; and
   a second cell for storing and providing a bit of data, the second cell having an input and an output, the input of the second cell coupled to the second bit line, and the output of the second cell coupled to the first bit line; and wherein the memory unit is capable of being simultaneously written using the first bit line to write the first cell and the second line to write the second cell, and the memory unit is capable of being simultaneously read using the second bit line to read the first cell and the first bit line to read the second cell.

14. The memory array of claim 13, wherein the input of the first cell is coupled to the first bit line by a first transistor, the first transistor having a gate coupled to receive a first port write signal for selectively coupling the input of the first cell to the first bit line.

15. The memory array of claim 14, wherein the output of the first cell is coupled to the second bit line by a second transistor, the second transistor having a gate coupled to receive a second port read signal for selectively coupling the output of the first cell to the second bit line.

16. The memory array of claim 15, wherein the input of the second cell is coupled to the second bit line by a third transistor, the third transistor having a gate coupled to receive a second port write signal for selectively coupling the input of the second cell to the second bit line.

17. The memory array of claim 16, wherein the output of the second cell is coupled to the first bit line by a fourth transistor, the fourth transistor having a gate coupled to receive a first port read signal for selectively coupling the output of the second cell to the first bit line.

18. The memory array of claim 1, wherein the control logic is capable of simultaneously reading the first port and the second port of the selected memory unit using the first bit line and the second bit line.

* * * * *